United States Patent
Zhang

(10) Patent No.: US 11,520,171 B2
(45) Date of Patent: Dec. 6, 2022

(54) DISPLAY PANEL MANUFACTURING METHOD AND MANUFACTURING DEVICE

(71) Applicants: HKC Corporation Limited, Shenzhen (CN); Chongqing HKC Optoelectronics Technology Co., Ltd., Chongqing (CN)

(72) Inventor: Guanghui Zhang, Chongqing (CN)

(73) Assignees: HKC Corporation Limited, Shenzhen (CN); Chongqing HKC Optoelectronics Technology Co., Ltd., Chongqing (CN)

(*) Notice: Subject to any disclaimer, the term of this patent is extended or adjusted under 35 U.S.C. 154(b) by 410 days.

(21) Appl. No.: 16/640,297

(22) PCT Filed: Jul. 31, 2018

(86) PCT No.: PCT/CN2018/097804
§ 371 (c)(1),
(2) Date: Jun. 16, 2020

(87) PCT Pub. No.: WO2019/042062
PCT Pub. Date: Mar. 7, 2019

(65) Prior Publication Data
US 2020/0310165 A1    Oct. 1, 2020

(30) Foreign Application Priority Data
Aug. 29, 2017  (CN) .......................... 201710757119.7

(51) Int. Cl.
*G02F 1/1333*  (2006.01)
*G02F 1/01*    (2006.01)
*H01L 23/544*  (2006.01)

(52) U.S. Cl.
CPC .......... *G02F 1/0102* (2013.01); *H01L 23/544* (2013.01); *G02F 1/133354* (2021.01)

(58) Field of Classification Search
CPC ................ G02F 1/0102; G02F 1/1333; G02F 1/133354; G02F 1/1303; H01L 23/544; H01L 2223/54426
See application file for complete search history.

(56) References Cited

U.S. PATENT DOCUMENTS

| | | | | |
|---|---|---|---|---|
| 2004/0263768 A1* | 12/2004 | Lee | .................... | G02F 1/133351 349/158 |
| 2008/0273159 A1* | 11/2008 | Seok | .................... | G02F 1/1347 349/158 |
| 2015/0179586 A1* | 6/2015 | Youk | .................... | G02F 1/13452 427/58 |

FOREIGN PATENT DOCUMENTS

| | | | | |
|---|---|---|---|---|
| CN | 101046591 A | 10/2007 | | |
| CN | 101661186 | * 3/2010 | ........... | G02F 1/1333 |
| CN | 104297980 A | 1/2015 | | |
| CN | 105026962 A | 11/2015 | | |

* cited by examiner

*Primary Examiner* — Thoi V Duong
(74) *Attorney, Agent, or Firm* — Wang Law Firm, Inc.

(57) ABSTRACT

The present disclosure illustrates a display panel manufacturing method including steps: disposing an alignment mark on a display panel; using an invisible-light identifier device to identify the alignment mark; and, processing the display panel according to the identified alignment mark. The invisible-light identifier device is configured to identify invisible light having wavelength longer than visible light.

14 Claims, 10 Drawing Sheets

| Electromagnetic wave | | | | | | |
|---|---|---|---|---|---|---|
| Invisible light | | | Visible light | Invisible light | | |
| T ray | X ray | UV ray | Purple Indigo Blue Green Yellow Orange Red | Infrared light | Microwave | Radio wave |

FIG. 4

DISPLAY PANEL MANUFACTURING METHOD AND MANUFACTURING DEVICE

CROSS-REFERENCE TO RELATED APPLICATIONS

This application is a National Stage Application of PCT International Patent Application No. PCT/CN2018/097804 filed on Jul. 31, 2018, under 35 U.S.C. § 371, which claims priority to and the benefit of Chinese Patent Application No. 201710757119.7, filed on Aug. 29, 2017, the disclosures of which are incorporated herein in their entirety by reference.

BACKGROUND

1. Field

The present disclosure relates to a display technology field, more particularly to a display panel manufacturing method and display panel manufacturing apparatus.

2. Description of the Related Art

Display devices are widely applied because of their advantages of thin-size, power-saving, and non-radiation. In recent years, most displays are backlight-type display device including a display panel and a backlight module. The working principle of the display panel is that liquid crystal molecules are disposed between two substrates disposed in parallel with each other, and a drive voltage is applied on the two substrates to control orientation of liquid crystal molecules to refract light emitted from the backlight module, so as to display an image.

Thin film transistor-liquid crystal displays (TFT-LCD) have advantages of low power consumption, excellent screen image quality and higher production yield, so the TFT-LCD device gradually become a main stream display product. Similarly, the TFT display includes a display panel and a backlight module, and the display panel includes a color film substrate and a TFT substrate, and transparent electrodes are formed on the relatively-inner side of the substrate. A liquid crystal layer is disposed between the two substrates. By using electric field to control orientation of the liquid crystal molecule to change polarization state of light, the substrate of the display panel can selectively pass or block light, so that the display panel can display an image.

In recent years, during manufacturing process of the display panel, an alignment mark is identified with visible light but the identification effect is not good enough, which results in poor accuracy of alignment of the display panel. As a result, the quality and production efficiency of display panel are affected seriously,

SUMMARY

In order to solve above-mentioned problem, the present disclosure is to provide a display panel manufacturing method, so as to improve identification rate for the alignment mark.

According to an embodiment, the present disclosure provides a display panel manufacturing method including steps: disposing an alignment mark on a display panel; using an invisible-light identifier device to identify the alignment mark, wherein the invisible-light identifier device is configured to identify invisible light having wavelength longer than visible light; and processing the display panel according to the identified alignment mark.

Preferably, the step of using the invisible-light identifier device to identify the alignment mark, further includes steps of: disposing an invisible light source at a side of the display panel, and using the invisible light source to emit invisible light having wavelength longer than visible light; disposing the invisible-light identification device at the other side of the display panel; using the invisible light source to emit invisible light having wavelength longer than visible light, to the display panel; and using the invisible-light identification device to identify the alignment mark with the invisible light emitted from the invisible light source.

Therefore, the invisible light source and the invisible-light identification device are disposed at two sides of the display panel, so the invisible-light light source can emit invisible light and the invisible-light identification device can sense the invisible light transmitting through the display panel, so as to effectively improve identification rate for the alignment marks, and ensure good identification rate for the alignment mark; as a result, the display panel can be processed more accurately, thereby effectively improving quality of the display panel and facilitating to manufacture frameless display product.

Preferably, the step of processing the display panel according to the identified alignment mark further includes steps of: obtaining a cut path according to the alignment mark; and controlling a processing device to cut the display panel along the cut path.

By using the cut path based on the alignment mark, the cutting operation for the display panel can be very accurate, so that the display panel can be cut according to the requirement in size of the display panel, and a large display panel can be efficiently cut into several desired display panel, thereby increasing usage rate of the display panel and further reducing cost.

Preferably, the step of obtaining the cut path according to the alignment mark further includes: obtaining all identified alignment marks; and processing all identified alignment marks to form the cut path.

According to the cut path formed by all identified alignment marks, it can effectively prevent the cut path from being affected by the alignment mark not identified, so that the display panel can be cut more accurately, further ensure better quality of the display panel.

Preferably, the step of processing the display panel according to the identified alignment mark further includes: obtaining an alignment location according to the alignment mark; and controlling the processing device to align the display panel with a circuit board according to the alignment locations.

According to alignment location formed by the alignment mark, the display panel can be aligned very accurately, and the alignment locations of the display panel can be quickly adjusted according to different size of the display panel, so as to ensure accuracy of alignment between the display panel and a circuit board, and facilitate to assemble and dispose the display panel, thereby improving the production efficiency of the display panel. Compared with manual alignment, the alignment technology of the present disclosure can provide more accurate alignment, to ensure better quality of the display panel.

Preferably, the step of obtaining the alignment location according to the alignment mark further includes: obtaining all identified alignment marks; and processing all identified alignment marks to generate the alignment location.

According to the alignment location formed by all identified alignment marks, it can effectively prevent the alignment location from being affected by the alignment mark not identified, so that the alignment between the display panel and the circuit board can be more accurate, to facilitate to assemble and dispose the display panel, thereby ensuring better quality of the display panel.

Preferably, the step of disposing the alignment mark on the display panel further comprises: providing a substrate; disposing an active switch on the substrate; disposing an alignment mark at the side of the substrate where the active switch is disposed; and disposing the light shielding layer at the other side of the substrate.

The substrate includes a display area and a non-display area, and the alignment mark can be disposed in the non-display area of the substrate and at a side of the substrate where the active switch is disposed, so as to effectively prevent the display panel from being affected by the alignment mark, thereby ensuring better display effect of the display panel. Furthermore, during the cutting process on the display panel, it can ensure the nice cutting effect and prevent the liquid crystal from flowing out, so as to decrease process difficulty, reduce processing time, improve cutting efficiency of the liquid crystal panel, and reduce the production cost.

Preferably, wavelength of the invisible light source and sensitivity of the invisible-light identification device are adjusted according to a light transmission value of the light shielding layer on the display panel. Therefore, by adaptively adjusting wavelength of the invisible light source and sensitivity of the invisible-light identification device according to a light transmission value of the light shielding layer on the display panel, the alignment mark can be identified more quickly and accurately, and the identification rate for the alignment mark can be effectively improved, to guarantee good identification rate for the alignment mark, so that the display panel can be processed more accurately, thereby effectively improving quality of the display panel, facilitate to manufacture frameless display product.

According to an embodiment, the present disclosure provides a display panel manufacturing method includes steps: providing a substrate; disposing an active switch on the substrate; disposing alignment marks at the side of the substrate where the active switch is disposed; disposing the light shielding layer at the other side of the substrate; disposing an invisible light source at a side of the display panel, and using the invisible light source to emit the invisible light having wavelength longer than visible light; disposing the invisible-light identification device at the other side of the display panel; using the invisible light source to emit the invisible light having wavelength longer than visible light, to the display panel; using the invisible-light identification device to identify the alignment marks with the invisible light emitted from the invisible light source; obtaining all identified alignment marks; processing all identified alignment marks to form the cut path; and controlling a processing device to cut the display panel along the cut path.

According to an embodiment, the present disclosure provides a display panel manufacturing apparatus including a marking device configured to dispose an alignment mark on the display panel; an invisible-light identifier device configured to identify the alignment mark; and a processing device configured to process the display panel according to the identified alignment mark. The invisible-light identifier device includes an invisible light source and an invisible-light identification device matching with the invisible light source, the processing device comprises a cutting tool head configured to cut the display panel, and a mirror panel configured to reflect light form the invisible light source.

Preferably, the invisible light source is disposed at a side of the display panel and configured to emit the invisible light having wavelength longer than visible light. The invisible-light identification device is disposed at the other side of the display panel, the invisible light source emit the invisible light having wavelength longer than visible light, to the display panel, and the invisible-light identification device identifies the alignment mark with the invisible light emitted from the invisible light source.

Preferably, wavelength of the invisible light source and sensitivity of the invisible-light identification device are adjusted according to a light transmission value of the light shielding layer on the display panel.

Preferably, the invisible light is infrared light or microwave.

Preferably, the invisible-light identifier device obtains a cut path according to the alignment mark, and the processing device cuts the display panel along the cut path.

Preferably, the invisible-light identifier device obtains all identified alignment marks, and forms the cut path according to all identified alignment marks.

Preferably, the invisible-light identifier device obtains a cut path according to the alignment mark, and the processing device aligns the display panel with a circuit board by the alignment location.

Preferably, the invisible-light identifier device obtains all identified alignment marks, and processes all identified alignment marks to form the alignment location.

Preferably, the display panel can be LCD panel, OLED panel, Q LED panel or plasma panel.

According to an embodiment, the present disclosure provides a display panel which is manufactured by any of above-mentioned methods.

According to the present disclosure, the invisible-light identifier device can emit invisible light and then receive the invisible light transmitting through the display panel, so as to effectively improve identification rate for the alignment marks to ensure good identification rate, so that the display panel can be processed more accurately, thereby effectively improving quality of the display panel and facilitating to manufacture frameless display product; furthermore, it is just required to slightly improve the original production apparatus, so expense in purchase of new apparatus can be effectively reduced, production cost of the display panel can also be decreased greatly, and the display panel can be more competitive.

BRIEF DESCRIPTION OF THE DRAWINGS

The structure, operating principle and effects of the present disclosure will be described in detail by way of various embodiments which are illustrated in the accompanying drawings.

FIG. 4 is a schematic view of electromagnetic wave used in an embodiment of the present disclosure.

DETAILED DESCRIPTION OF THE PREFERRED EMBODIMENTS

Figure 1:
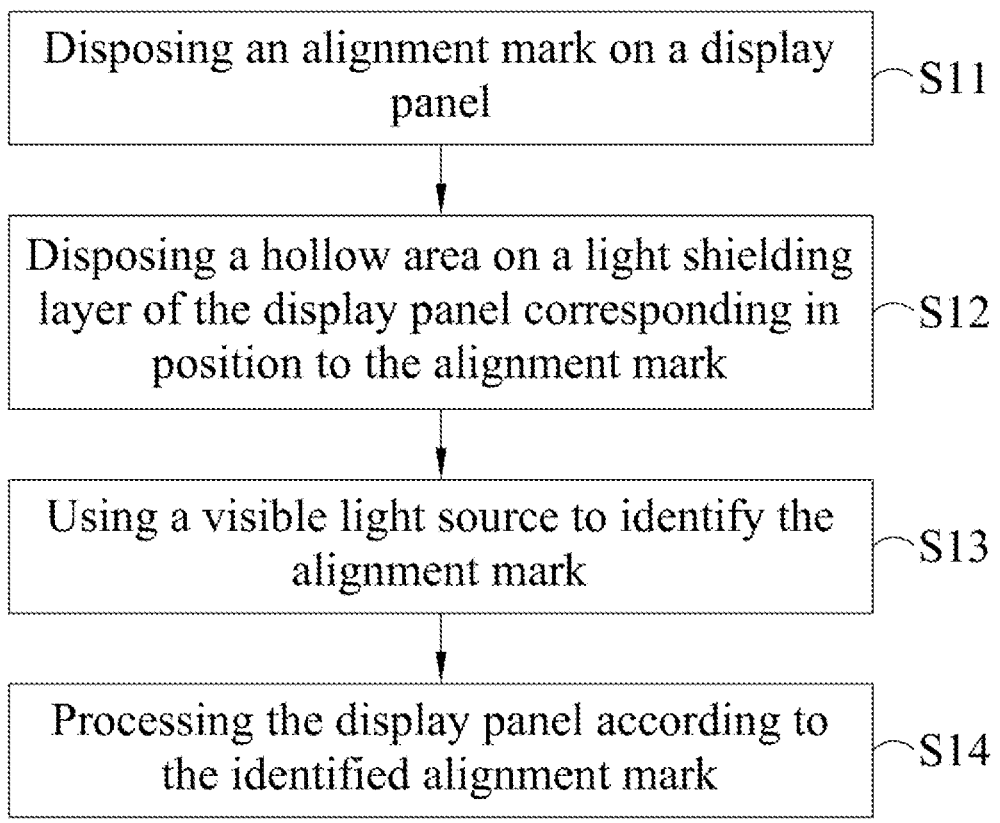
FIG. 1 is a flowchart showing the steps in an operation of a display panel manufacturing method of an embodiment of the present disclosure.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when a component is referred to as being "on", "connected to", "coupled to", or "adjacent to" another component, it can be directly on, connected to, electrically connected to, mechanically connected to, coupled to, or adjacent to the other component, or intervening components may also be present. It will also be understood that when a component is referred to as being "between" two components, it can be the only component between the two components, or one or more intervening components may also be present.

Please refer to FIG. 1, which shows a display panel manufacturing method including following steps, comprising S11, S12, S13 and S14.

The step S11 is a step of disposing an alignment mark on a display panel.

The step S12 is a step of disposing a hollow area on a light shielding layer of the display panel corresponding in position to the alignment mark.

The step S13 is a step of using a visible light source to identify the alignment mark.

The step S14 is a step of processing the display panel according to the identified alignment mark.

The hollow area, disposed on the light shielding layer corresponding in position to the alignment mark, can effectively pass visible light through the light shielding layer, so as to facilitate to use the visible light source to identify the alignment mark.

However, it is not easy to effectively control the position of hollow area, so that the light shielding layer is easy to block the alignment mark, which results in very low identification rate for the alignment mark; as a result, the display panel cannot be effectively processed according to the alignment mark, For this reason, the present disclosure is to provide a display panel manufacturing method to improve the identification rate for alignment marks.

Figure 2:
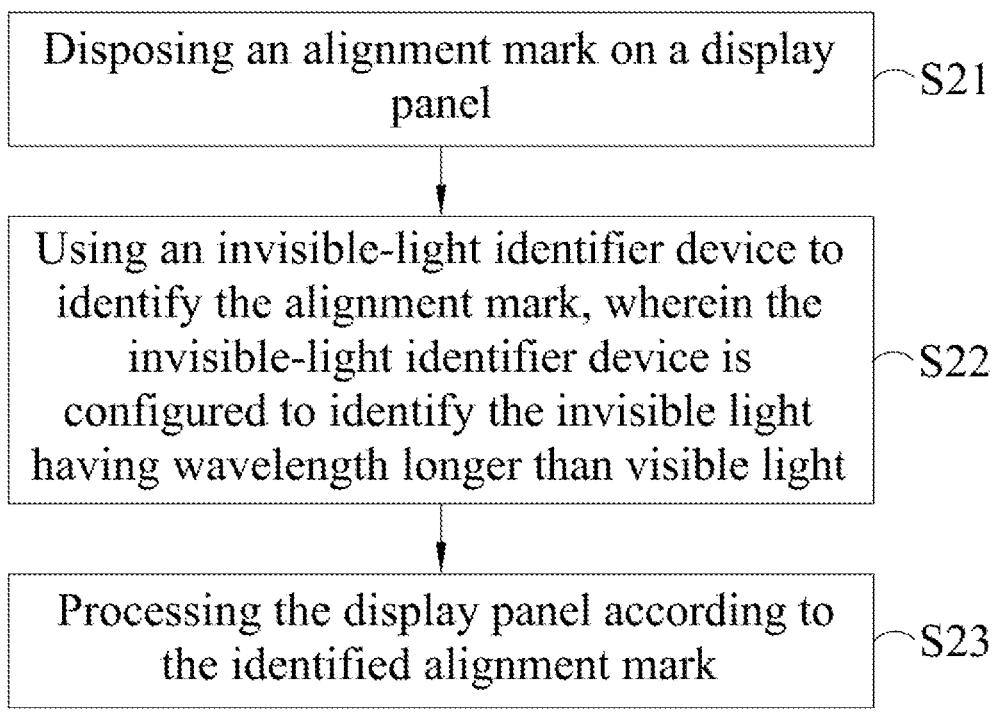
FIG. 2 is a flowchart showing the steps in an operation of a display panel manufacturing method of another embodiment of the present disclosure.
Figure 10:
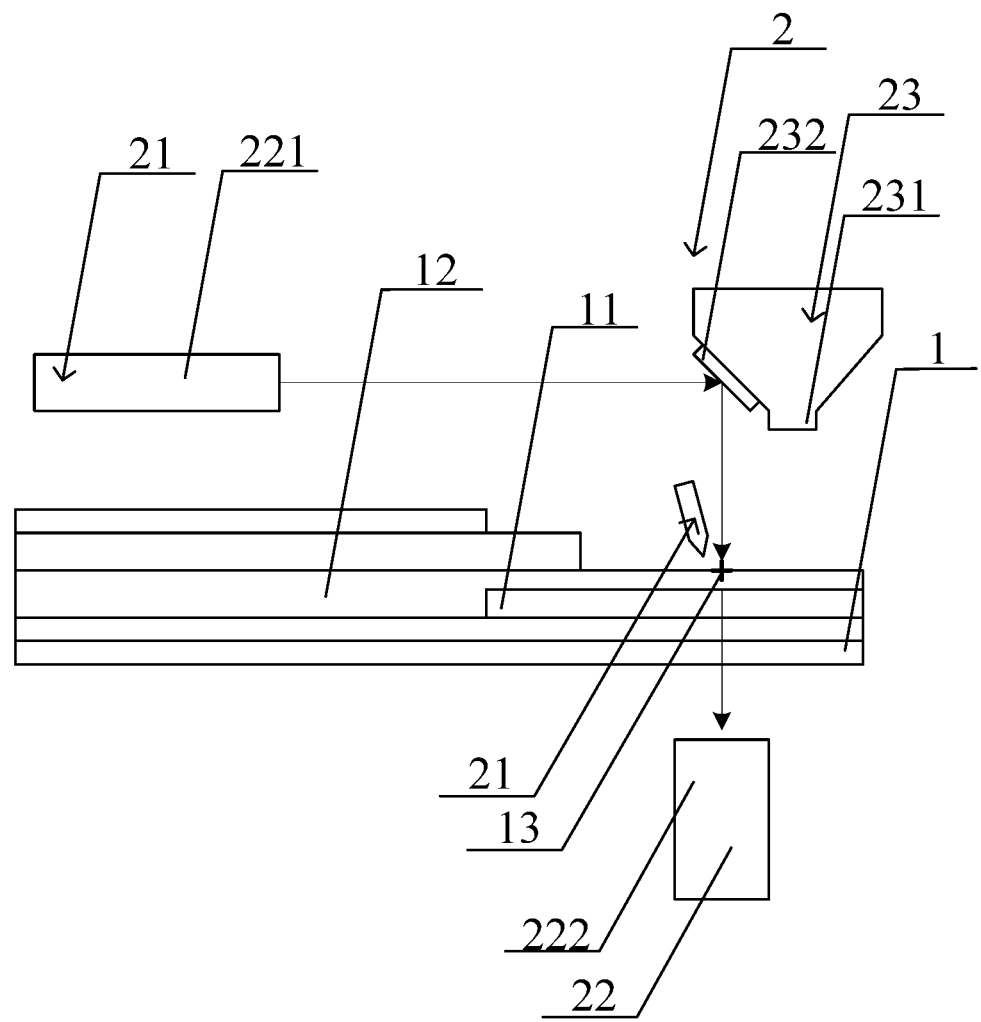
FIG. 10 is a schematic structural view of a display panel manufacturing apparatus of another embodiment of the present disclosure.

Please refer to FIGS. 2 and 10, which show a display panel manufacturing method including following steps S21, S22 and S23.

The step S21 is a step of disposing an alignment mark on a display panel.

The step S22 is a step of using an invisible-light identifier device to identify the alignment mark, wherein the invisible-light identifier device is configured to identify the invisible light having wavelength longer than visible light.

The step S23 is a step of processing the display panel according to the identified alignment mark.

In cooperation with the marking device 21, the invisible-light identifier device 22 can emit invisible light and then receive the invisible light transmitting through the display panel, to effectively improve identification rate for the alignment marks 13, and ensure good identification rate for the alignment mark 13, so that the display panel can be processed more accurately, thereby effectively improving quality of the display panel and facilitating to manufacture frameless display product; and, it is just required to slightly improve the original production apparatus, so expense in purchase of new apparatus can be effectively decreased, production cost of the display panel can be decreased greatly, and the display panel can be more competitive.

Figure 3:
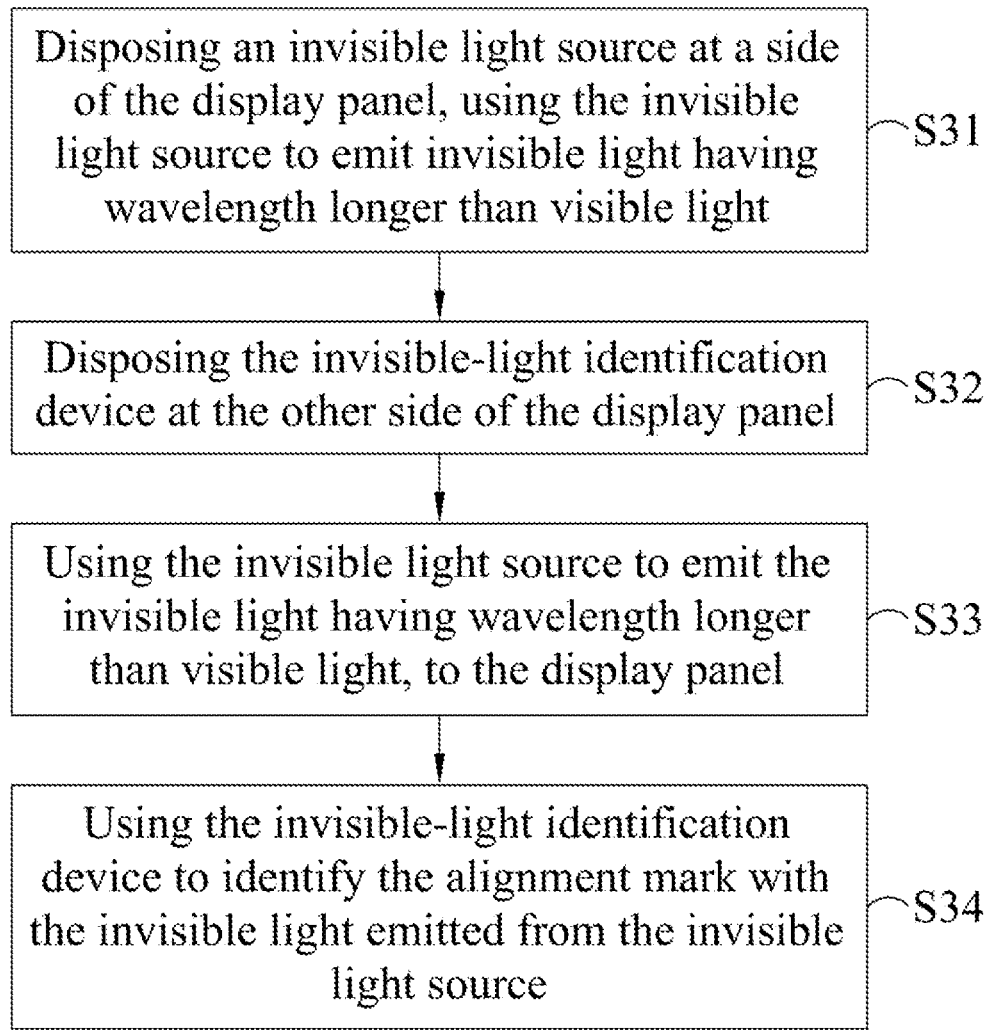
FIG. 3 is a flowchart showing the steps in an operation of a display panel manufacturing method of another embodiment of the present disclosure.

Please refer FIGS. 3 and 10. The invisible-light identifier device 22 includes an invisible light source 221 and an invisible-light identification device 222 matching with the invisible light source 221. The step of using the invisible-light identifier device 22 to identify the alignment mark 13, further includes following steps S31, S32, S33 and S34.

The step S31 is a step of disposing an invisible light source at a side of the display panel, using the invisible light source to emit invisible light having wavelength longer than visible light.

The step S32 is a step of disposing the invisible-light identification device at the other side of the display panel.

The step S33 is a step of using the invisible light source to emit the invisible light having wavelength longer than visible light, to the display panel.

The step S34 is a step of using the invisible-light identification device to identify the alignment mark with the invisible light emitted from the invisible light source.

The invisible light source 221 and the invisible-light identification device 222 are disposed at two sides of the display panel, respectively, so that invisible light emitted from the invisible light source 221 can effectively pass the display panel, and the invisible-light identification device 222 disposed at the other side of the display panel can effectively sense the invisible light, to improve the identification rate for the alignment mark 13, and identify the alignment mark 13 very accurately, so that the display panel can be processed more accurately, thereby effectively improving quality of the display panel and facilitating to manufacture frameless display product.

The invisible light source 221 can emit invisible light, and the invisible-light identification device 222 works like an infrared night vision device to effectively and accurately identify the alignment mark 13; furthermore, it is just required to slightly improve the original production apparatus, for example, to replace the visible light source by the invisible light source 221, and adjust the sensitivity of the invisible-light identification device 222; as a result, the expense in purchase of new apparatus can be effectively decreased, production cost of the display panel greatly can be decrease and the display panel can be more competitive.

Preferably, the invisible light can be infrared light or microwave. As shown in FIG. 4, the infrared light is electromagnetic wave (or light) having wavelength longer than visible light, for example, the wavelength of infrared light is in a range of 1 mm to 770 nanometer, and located at outer side of red light on light spectrum.

When visible or invisible light, having certain wavelength, is radiated on a surface of metal material, the metal material generates electron flow, which is called opto-electric effect. Any object in nature is an infrared light source outwardly radiating infrared light continually all time.

Figure 5:
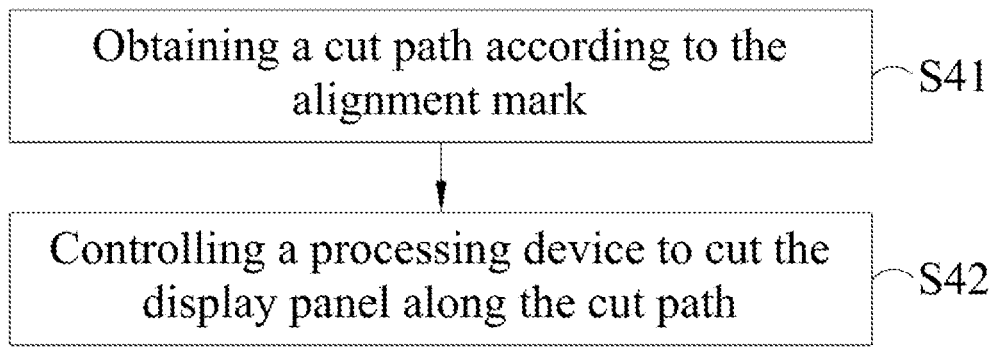
FIG. 5 is a flowchart showing the steps in an operation of a display panel manufacturing method of another embodiment of the present disclosure.

Infrared night vision device is developed based on opto-electric effect of infrared light. The infrared night vision device is equipped with a manual infrared light source, and can project the invisible infrared light radiated or reflected from the object in nature, on a photocathode of a photoelectric converter through objective lens of an optoelectronic telescope. Based on the opto-electric effect, electron flow is generated from the photocathode and emitted to a positively-charged fluorescent screen with very high speed. The infrared night vision device also includes electronic lens disposed between the photocathode and the fluorescent screen, to control electrons to emit to the fluorescent screen along certain paths, and at the same time, reverse the inverted image to an erect image. In order to observe image easily, the optoelectronic telescope includes an eyepiece disposed between the fluorescent screen and the user's eye, thereby facilitating to view night scene clearly, Please refer to FIGS. 5 and 10. The step of processing the display panel according to the identified alignment mark further includes following steps S41 and S42.

The step S41 is a step of obtaining a cut path according to the alignment mark.

The step S42 is a step of controlling a processing device to cut the display panel along the cut path.

The invisible-light identifier device 22 obtains the cut path according to the alignment mark 13, to make cutting operation for the display panel very accurate, so that the display panel can be cut according to the requirement in size of the display panel, and a large display panel can be efficiently cut into several desired display panel. As a result, the usage rate of the display panel can be effectively improved and the cost of the display panel can be reduced.

Furthermore, during production process, the display panel having defects can be cut accurately to remove the defective part, to obtain a small size display panel; as a result, the display panel having defects can be reused, and a scrap rate of the display panels can be reduced, so as to achieve better environmental protection and save more production cost.

Figure 6:
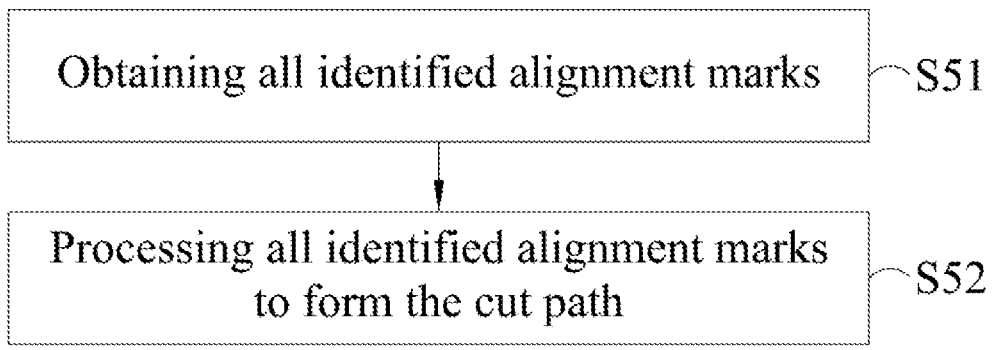
FIG. 6 is a flowchart showing the steps in an operation of a display panel manufacturing method of another embodiment of the present disclosure.

Please refer to FIGS. 6 and 10. The step of obtaining the cut path according to the alignment mark further includes following steps S51 and S52.

The step S51 is a step of obtaining all identified alignment marks.

The step S52 is a step of processing all identified alignment marks to form the cut path.

The invisible-light identifier device 22 obtains all identified alignment marks 13, and then process all identified alignment marks 13 to form the cut path, to effectively prevent the cut path from being affected by the alignment mark 13 not identified, so that the display panel can be cut more accurately, to ensure better quality of the display panel.

Figure 7:
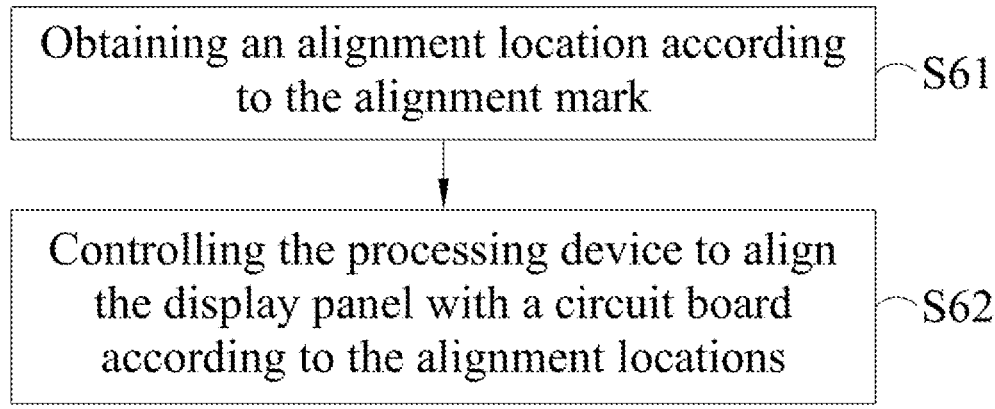
FIG. 7 is a flowchart showing the steps in an operation of a display panel manufacturing method of another embodiment of the present disclosure.

Please refer to FIGS. 7 and 10. The step of processing the display panel according to the identified alignment mark further includes following steps S61 and S62.

The step S61 is a step of obtaining an alignment location according to the alignment mark.

The step S62 is a step of controlling the processing device to align the display panel with a circuit board according to the alignment locations.

After the invisible-light identifier device 22 obtains the alignment location according to the alignment mark 13, the display panel can be aligned very accurately and the alignment locations of the display panel can be quickly adjusted according to different size of the display panel, so as to ensure accuracy of alignment between the display panel and a circuit board, facilitate to assemble and dispose the display panel, and further improve the production efficiency of the display panel. Compared with manual alignment, the technology of the present disclosure can provide more accurate alignment of the display panel, to enable better quality of the display panel, and effectively reduce the amount of defective display panel due to inaccurate alignment, and save more production cost.

Figure 8:
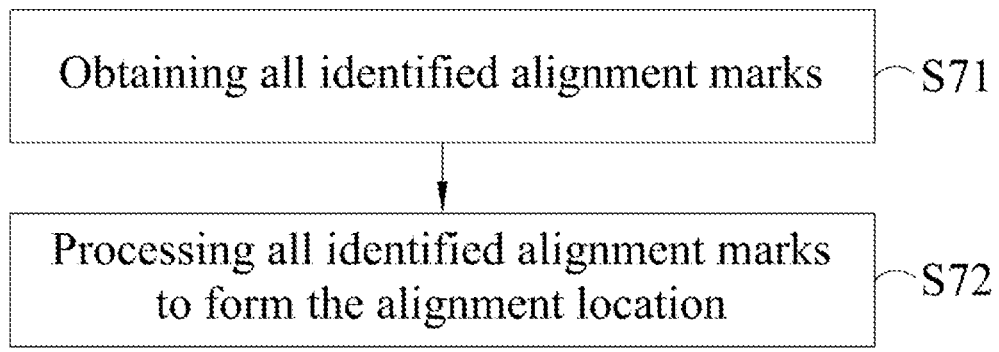
FIG. 8 is a flowchart showing the steps in an operation of a display panel manufacturing method of another embodiment of the present disclosure.

Please refer to FIGS. 8 and 10. The step of obtaining an alignment location according to the alignment mark further includes following steps S71 and S72.

The step S71 is a step of obtaining all identified alignment marks.

The step S72 is a step of processing all identified alignment marks to form the alignment location.

The invisible-light identifier device 22 can obtain all identified alignment marks 13, and then processes all identified alignment marks 13 to form the alignment location, so as to effectively prevent the alignment location from being affected by the alignment mark 13 not identified, and make alignment between the display panel and the circuit board more accurate, thereby facilitating to assemble and dispose the display panel and further ensuring better quality of the display panel.

Figure 9:
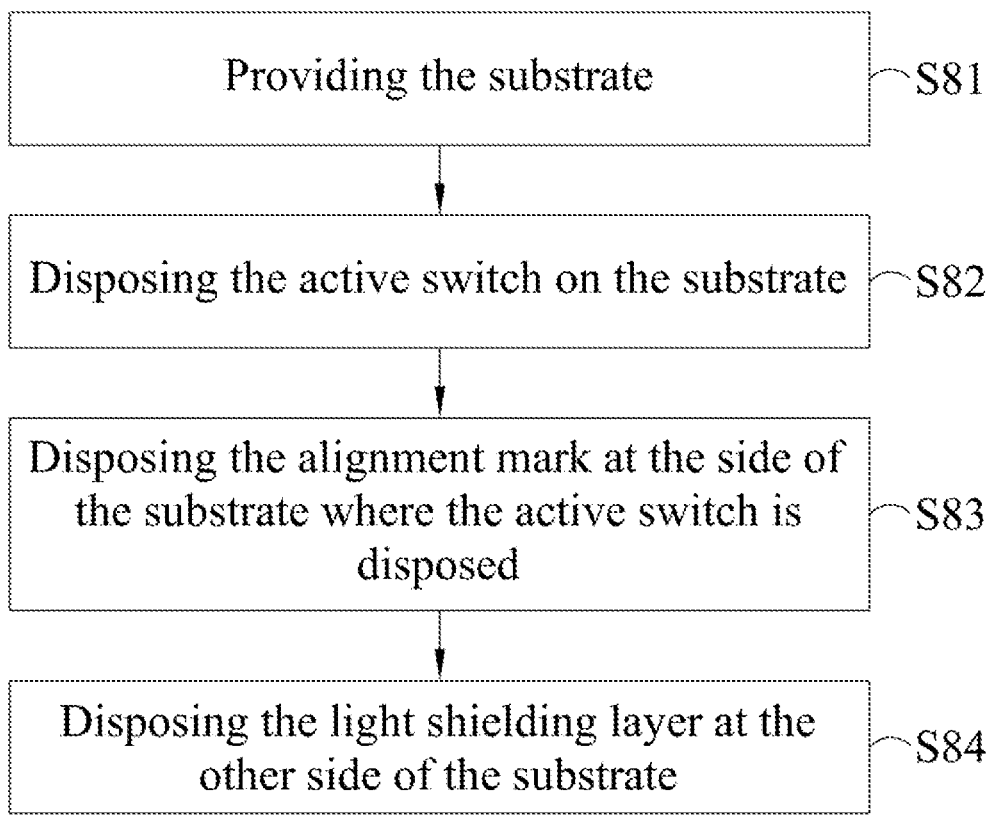
FIG. 9 is a flowchart showing the steps in an operation of a display panel manufacturing method of another embodiment of the present disclosure.

Please refer to FIGS. 9 and 10. The display panel includes a substrate 1, a light shielding layer 11 and an active switch 12. The step of disposing the alignment mark on the display panel further includes following steps S81, S82, S83 and S84.

The step S81 is a step of providing the substrate.

The step S82 is a step of disposing the active switch on the substrate.

The step S83 is a step of disposing the alignment mark at the side of the substrate where the active switch is disposed.

The step S84 is a step of disposing the light shielding layer at the other side of the substrate.

The alignment mark is disposed correspondingly in position to the light shielding layer, the alignment mark is disposed at a side of the light shielding layer, and the invisible-light identifier device is disposed at the other side of the light shielding layer.

The substrate 1 includes a display area and a non-display area, and the alignment mark 13 can be disposed in the non-display area of the substrate 1 and at a side of the substrate 1 where the active switch 12 is disposed, so as to effectively prevent the display panel from being affected by the alignment mark 13, thereby ensuring better display effect of the display panel. During the cutting process on the display panel, it can ensure the nice cutting effect and prevent the liquid crystal from flowing out, so as to decrease process difficulty, reduce processing time, improve cutting efficiency of the liquid crystal panel, and reduce the production cost.

The wavelength of the invisible light source 221 and sensitivity of the invisible-light identification device 222 can be adjusted according to the light transmission value of the light shielding layer 11 on the display panel.

The wavelength of the invisible light source 221 and the sensitivity of the invisible-light identification device 222 can be adjusted according to the light transmission value of the light shielding layer 11, in order to identify the alignment mark 13 more quickly and accurately, and effectively improve identification rate for the alignment mark 13 and ensure good identification rate for the alignment mark 13, so that the display panel can be processed more accurately, to effectively improve quality of the display panel and facilitate to manufacture frameless display product.

Please refer to FIG. 10. According to the other embodiment, the present disclosure provides a display panel manufacturing apparatus 2 including the marking device 21 configured to dispose the alignment mark 13 on the display panel; the invisible-light identifier device 22 configured to identify the alignment mark 13; and the processing device 23 configured to process the display panel according to the identified alignment mark 13.

The marking device 21 can mark at a predetermined position of the display panel, to make the position of the alignment mark 13 more accurate. The invisible-light identifier device 22 can emit invisible light and then receive the invisible light transmitting through the display panel, to effectively improve identification rate for the alignment mark 13 and ensure good identification rate for the alignment mark 13, so that the display panel can be processed more accurately, to effectively improve quality of the display panel and facilitate to manufacture frameless display product; furthermore, it is just required to slightly improve the original production apparatus, for example, to replace the visible light source by the invisible light source 221, so that the expense in purchase of new apparatus can be effectively decreased, the production cost of the display panel can be decreased greatly and the display panel can be more competitive. The processing device 23 can process the display panel, to ensure better quality of the display panel, so as to facilitate to manufacture frameless display product.

The invisible-light identifier device 22 includes the invisible light source 221 and the invisible-light identification device 222 matching with the invisible light source 221, and the processing device 23 includes a cutting tool head 231 configured to cut the display panel and a mirror panel 232 configured to reflect light emitted from the invisible light source 221. The invisible light source 221 and the substrate 1 are disposed in parallel with each other. The mirror panel 232 is fixed on the processing device 23, and a 45-degree angle is formed between the mirror panel 232 and the substrate 1. The mirror panel 232 is configured to reflect the invisible light emitted from the invisible light source 221, to make the reflected invisible light radiate perpendicularly to the substrate 1, so that the invisible-light identification device 222 can identify the alignment mark 13 more accurately and effectively, thereby effectively improving quality of the display panel and facilitating to manufacture frameless display product.

According to the other embodiment of the present disclosure, the present disclosure provides a display panel which can be manufactured by aforementioned display panel manufacturing methods.

According to another embodiment, the present disclosure provides a display device including a backlight module and the display panel which is manufactured by aforementioned manufacturing method.

In the embodiment, the substrate 1 can be made by glass or plastic.

In the embodiment, the display panel includes liquid crystal panel, OLED display panel, Q LED display panel, plasma panel or other display panel. For example, the liquid crystal panel can include an array substrate and a color film substrate which are disposed opposite to each other. The liquid crystal units and photo spacers are disposed between the array substrate and the color film. The array substrate includes thin-film transistors formed thereon, and the CF substrate includes a color filter layer formed thereon.

In the embodiment, the CF substrate can include a TFT array. The color film and the TFT array can be formed on the same substrate. The array substrate can include a color filter layer.

In the embodiment, the display panel of the present disclosure can be a curved panel.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A display panel manufacturing method, comprising:
disposing an alignment mark on a display panel;
using an invisible-light identifier device to identify the alignment mark, wherein the invisible-light identifier device is configured to identify invisible light having a wavelength longer than visible light; and
processing the display panel according to the identified alignment mark;
wherein the step of using the invisible-light identifier device to identify the alignment mark, further comprises:
disposing an invisible light source at a first side of the display panel, and using the invisible light source to emit the invisible light;
disposing the invisible-light identifier device at a second side of the display panel;
using the invisible light source to emit the invisible light to the display panel; and
using the invisible-light identifier device to identify the alignment mark with the invisible light emitted from the invisible light source;

wherein the wavelength of the invisible light source and sensitivity of the invisible-light identifier device are adjusted according to a light transmission value of a light shielding layer on the display panel.

2. The display panel manufacturing method according to claim 1, wherein the step of processing the display panel according to the identified alignment mark, further comprises:
obtaining a cut path according to the alignment mark; and
controlling a processing device to cut the display panel along the cut path.

3. The display panel manufacturing method according to claim 2, wherein the step of obtaining the cut path according to the alignment mark, further comprises:
obtaining all identified alignment marks; and
processing all identified alignment marks to form the cut path.

4. The display panel manufacturing method according to claim 1, wherein the step of processing the display panel according to the identified alignment mark, further comprises:
obtaining an alignment location according to the alignment mark; and
controlling a processing device to align the display panel with a circuit board according to the alignment location.

5. The display panel manufacturing method according to claim 4, wherein the step of obtaining the alignment location according to the alignment mark, further comprises:
obtaining all identified alignment marks; and
processing all identified alignment marks to generate the alignment location.

6. The display panel manufacturing method according to claim 1, wherein the step of disposing the alignment mark on the display panel, further comprises:
providing a substrate;
disposing an active switch on the substrate;
disposing the alignment mark at a first side of the substrate where the active switch is disposed; and
disposing the light shielding layer at a second side of the substrate;
wherein the alignment mark is disposed correspondingly in position to the light shielding layer, the alignment mark is disposed at a first side of the light shielding layer, and the invisible-light identifier device is disposed at a second side of the light shielding layer.

7. A display panel manufacturing apparatus, comprising:
a marking device configured to dispose an alignment mark on a display panel;
an invisible-light identifier device configured to identify the alignment mark; and
a processing device configured to process the display panel according to the identified alignment mark;
wherein the invisible-light identifier device comprises an invisible light source and an invisible-light identifier device matching with the invisible light source, the processing device comprises a cutting tool head configured to cut the display panel, and a mirror panel configured to reflect light from the invisible light source.

8. The display panel manufacturing apparatus according to claim 7, wherein the invisible light source is disposed at a first side of the display panel and configured to emit the invisible light having a wavelength longer than visible light;
wherein the invisible-light identifier device is disposed at a second side of the display panel, the invisible light source emits the invisible light having the wavelength longer than the visible light, to the display panel, and the invisible-light identifier device identifies the alignment mark with the invisible light emitted from the invisible light source.

9. The display panel manufacturing apparatus according to claim 8, wherein the wavelength of the invisible light source and sensitivity of the invisible-light identifier device are adjusted according to a light transmission value of a light shielding layer on the display panel.

10. The display panel manufacturing apparatus according to claim 8, wherein the invisible light is infrared light or microwave.

11. The display panel manufacturing apparatus according to claim 7, wherein the invisible-light identifier device obtains a cut path according to the alignment mark, and the processing device cuts the display panel along the cut path.

12. The display panel manufacturing apparatus according to claim 11, wherein the invisible-light identifier device obtains all identified alignment marks, and forms the cut path according to all identified alignment marks.

13. The display panel manufacturing apparatus according to claim 7, wherein the invisible-light identifier device obtains a cut path according to the alignment mark, and the processing device aligns the display panel with a circuit board by an alignment location.

14. The display panel manufacturing apparatus according to claim 13, wherein the invisible-light identifier device obtains all identified alignment marks, and processes all identified alignment marks to form the alignment location.

* * * * *